(12) United States Patent
Kodama et al.

(10) Patent No.: US 10,978,375 B2
(45) Date of Patent: Apr. 13, 2021

(54) SEMICONDUCTOR DEVICE

(71) Applicants: SUMITOMO ELECTRIC DEVICE INNOVATIONS, INC., Kanagawa (JP); SUMITOMO ELECTRIC INDUSTRIES, LTD., Osaka (JP)

(72) Inventors: Akitada Kodama, Yokohama (JP); Masato Furukawa, Osaka (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 16/439,331

(22) Filed: Jun. 12, 2019

(65) Prior Publication Data

US 2019/0385934 A1    Dec. 19, 2019

(30) Foreign Application Priority Data

Jun. 13, 2018 (JP) .............................. JP2018-113200

(51) Int. Cl.
*H01L 23/48* (2006.01)
*H01L 23/495* (2006.01)
*H01L 23/00* (2006.01)
*H01L 23/66* (2006.01)
*H01L 23/047* (2006.01)
*H01L 23/10* (2006.01)
(Continued)

(52) U.S. Cl.
CPC ........ *H01L 23/481* (2013.01); *H01L 23/4952* (2013.01); *H01L 23/49548* (2013.01)

(58) Field of Classification Search
CPC ..... H01L 23/481; H01L 23/562; H01L 23/10; H01L 2223/6644; H01L 23/02; H01L 23/04; H01L 23/49833; H01L 23/055; H01L 23/49575; H01L 23/66; H01L 23/043; H01L 23/047; H01L 25/18; H01L 25/16; H01L 21/4817
See application file for complete search history.

(56) References Cited

U.S. PATENT DOCUMENTS 5,574,314 A * 11/1996 Okada ................. H01L 23/10
257/659
6,365,961 B1 * 4/2002 Tomie ................. H01L 23/66
257/664
(Continued)

FOREIGN PATENT DOCUMENTS

JP         2012-38837         2/2012

*Primary Examiner* — Marcos D. Pizarro
*Assistant Examiner* — Antonio B Crite
(74) *Attorney, Agent, or Firm* — Smith, Gambrell & Russell, LLP.

(57) ABSTRACT

A semiconductor device comprising a metal base, a metal frame, a semiconductor element, a feedthrough, and a metal side plate is disclosed. The semiconductor element is mounted on the metal base in a space defined by the metal base and the metal frame. The feedthrough is inserted into a cutout of the metal frame, and includes a wiring, a lower block mounting the wiring thereon, and an upper block mounted on the lower block. A combined sectional shape of the lower block and the upper block is a projecting shape. A part of the upper block is located inside the space. The metal side plate is provided between a side surface of the feedthrough and the cutout of the metal frame. The metal side plate has a projecting shape and covers the entire side surface of the feedthrough.

16 Claims, 6 Drawing Sheets

(51) Int. Cl.
*H01L 23/043* (2006.01)
*H01L 23/498* (2006.01)

(56) References Cited

U.S. PATENT DOCUMENTS 8,653,649 B2 * 2/2014 Tsujino .................. H01L 23/66
257/698
8,754,519 B2 * 6/2014 Hasegawa ............. H01L 23/047
257/678

* cited by examiner

SEMICONDUCTOR DEVICE

CROSS REFERENCE TO RELATED APPLICATIONS

The present application is based upon and claims the benefit of the priority from Japanese patent application No. 2018-113200 filed on Jun. 13, 2018, the entire contents of which are incorporated herein by reference.

TECHNICAL FIELD

The present disclosure relates to a semiconductor device.

BACKGROUND

In a field of semiconductor devices, electronic components such as a semiconductor element may be hermetically sealed for protection from moisture and foreign matters. Input and output of signals with respect to the sealed electronic components are performed via feedthroughs. In such a hermetically sealed package, a projecting shaped feedthrough made of alumina is applied with stress from a metal wall surrounding the feedthrough due to a temperature change to generate a crack, so that the hermeticity may be lost. JP2012-038837A discloses a configuration in which the thickness of the upper portion of the feedthrough is formed to be larger than the thickness of the metal wall so as to prevent the hermeticity from being lost.

SUMMARY

The present disclosure provides a semiconductor device. The semiconductor device comprises a metal base, a metal frame, a semiconductor element, a feedthrough, and a metal side plate. The metal frame is placed on the metal base. The metal frame is provided with at least one cutout penetrating therethrough. The semiconductor element is mounted on the metal base in a space defined by the metal base and the metal frame. The feedthrough is inserted into the cutout of the metal frame and mounted on the metal base. The feedthrough includes a wiring, a lower block, and an upper block. The wiring is configured to electrically connect the semiconductor element located inside the space with an electrical part located outside the semiconductor device. The lower block is made of a ceramic and mounts the wiring thereon. The upper block is made of a ceramic and is mounted on the lower block. A combined sectional shape of the lower block and the upper block is a projecting shape along a mounting direction of the upper block on the lower block. A part of the upper block is located inside the frame. The metal side plate is provided between a side surface of the feedthrough spreading along the extending direction of the wiring and the cutout of the metal frame. The metal side plate has a projecting shape and covers the entire side surface of the feedthrough.

BRIEF DESCRIPTION OF THE DRAWINGS

The foregoing and other purposes, aspects and advantages will be better understood from the following detailed description of embodiments of the present disclosure with reference to the drawings, in which.

DETAILED DESCRIPTION

Figure 1:
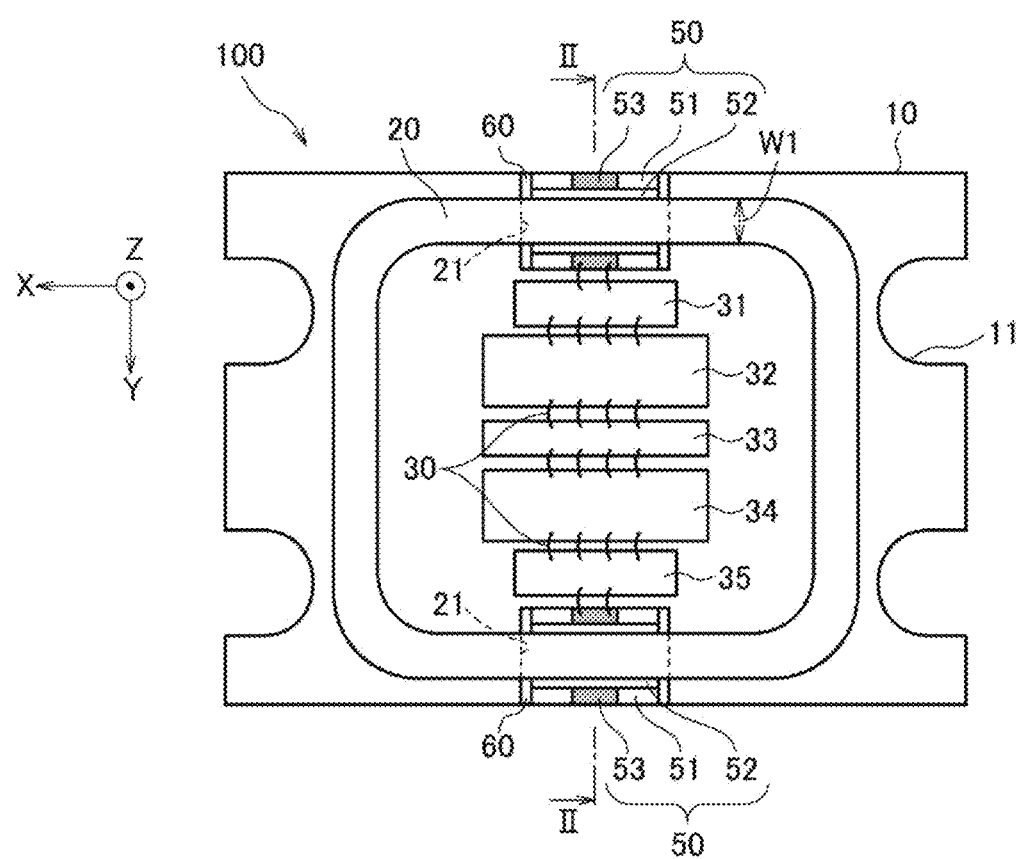
FIG. 1 is a plan view of a semiconductor device according to a first embodiment.

Problem to be Solved by the Present Disclosure

The semiconductor device disclosed in JP2012-038837A can reduce the stress concentrated on the connection point between the lower portion of the feedthrough and the upper portion of the feedthrough. However, in a semiconductor device used for a satellite or a semiconductor device mounted with a high-power semiconductor element, it has been required to more reliably prevent a crack caused by severe temperature conditions and heat cycles with large temperature changes from occurring.

Advantageous Effects of the Present Disclosure

According to the present disclosure, it is possible to provide a semiconductor device in which a crack in a feedthrough due to a temperature change is prevented from occurring.

DESCRIPTION OF EMBODIMENTS OF THE PRESENT DISCLOSURE

Embodiments of the present disclosure will be described. A semiconductor device according to one embodiment of the present disclosure comprises a metal base, a metal frame, a semiconductor element, a feedthrough, and a metal side plate. The metal frame is placed on the metal base. The metal frame is provided with at least one cutout penetrating therethrough. The semiconductor element is mounted on the metal base in a space defined by the metal base and the metal frame. The feedthrough is inserted into the cutout of the metal frame and mounted on the metal base. The feedthrough includes a wiring, a lower block, and an upper block. The wiring is configured to electrically connect the semiconductor element located inside the space with an electrical part located outside the semiconductor device. The lower block is made of a ceramic and mounts the wiring thereon. The upper block is made of a ceramic and is mounted on the lower block. A combined sectional shape of the lower block and the upper block is a projecting shape along a mounting direction of the upper block on the lower block. A part of the upper block is located inside the frame. The metal side plate is provided between a side surface of the feedthrough spreading along the extending direction of the wiring and the cutout of the metal frame. The metal side plate has a projecting shape and covers the entire side surface of the feedthrough. With this configuration, it is possible to prevent the occurrence of a crack in the feedthrough due to a temperature change.

As one embodiment, the metal side plate may be made of copper. Since both the upper block made of a ceramic and the lower block made of a ceramic of the feedthrough contacts with the metal frame made of a metal through the side plate that is made of copper and has a small Young's modulus, it is possible for this configuration to relieve the stress that the feedthrough receives from the metal frame.

As one embodiment, the metal side surface plate may further include a triangular reinforcement portion filling a first step of the side plate. The first step may be located inside the space. With this configuration, it is possible to further relieve the stress exerted on the bonded portion between the upper block made of a ceramic and the lower block made of a ceramic of the feedthrough.

As one embodiment, the feedthrough may further include a triangular prism-shaped reinforcement portion filling a second step of the feedthrough. The second step may be located inside the space. With this configuration, the bonded portion between the upper block made of a ceramic and the lower block made of a ceramic of the feedthrough is reinforced by the triangular reinforcement portion, so that it is possible to further relieve the influence of the stress.

As one embodiment, the metal side plate may have a thickness of at least 300 µm. With this configuration, it is possible to sufficiently relieve the stress that the feedthrough receives from the metal frame.

As one embodiment, the semiconductor device may comprise at least one electric circuit located inside the metal frame. The wiring of the feedthrough may be configured to electrically connect the semiconductor element to the electrical part via the at least one electric circuit.

As one embodiment, the semiconductor device may further comprise another feedthrough inserted into another cutout of the metal frame and mounted on the metal base. In this embodiment, the another feedthrough may include another wiring configured to electrically connect the semiconductor element with another electrical part located outside the semiconductor device, another lower block made of a ceramic and mounting the another wiring thereon, and another upper block made of a ceramic and mounted on the another lower block. A combined sectional shape of the another lower block and the another upper block may be a projecting shape along a mounting direction of the another upper block on the another lower block, and a part of the another upper block may be located inside the metal frame. In this embodiment, the feedthrough, the semiconductor element and the another feedthrough may be arranged along a straight line.

As one embodiment, the semiconductor device may further comprises another side plate covering entire opposite side surface of the feedthrough.

DETAIL OF EMBODIMENTS OF THE PRESENT DISCLOSURE

Hereinafter, details of embodiments of a semiconductor device according to the present disclosure will be described with reference to the drawings. In the following description, components denoted by the same reference numerals in different drawings are the same, and in some cases, the description thereof may be omitted. In addition, the present invention is not limited to examples in these embodiments but includes all modifications within the scope and the equivalent scope of the matters described in the claims. In addition, the present invention includes any combination of embodiments, as long as combinations of a plurality of the embodiments are possible.

First Embodiment

Figure 2:
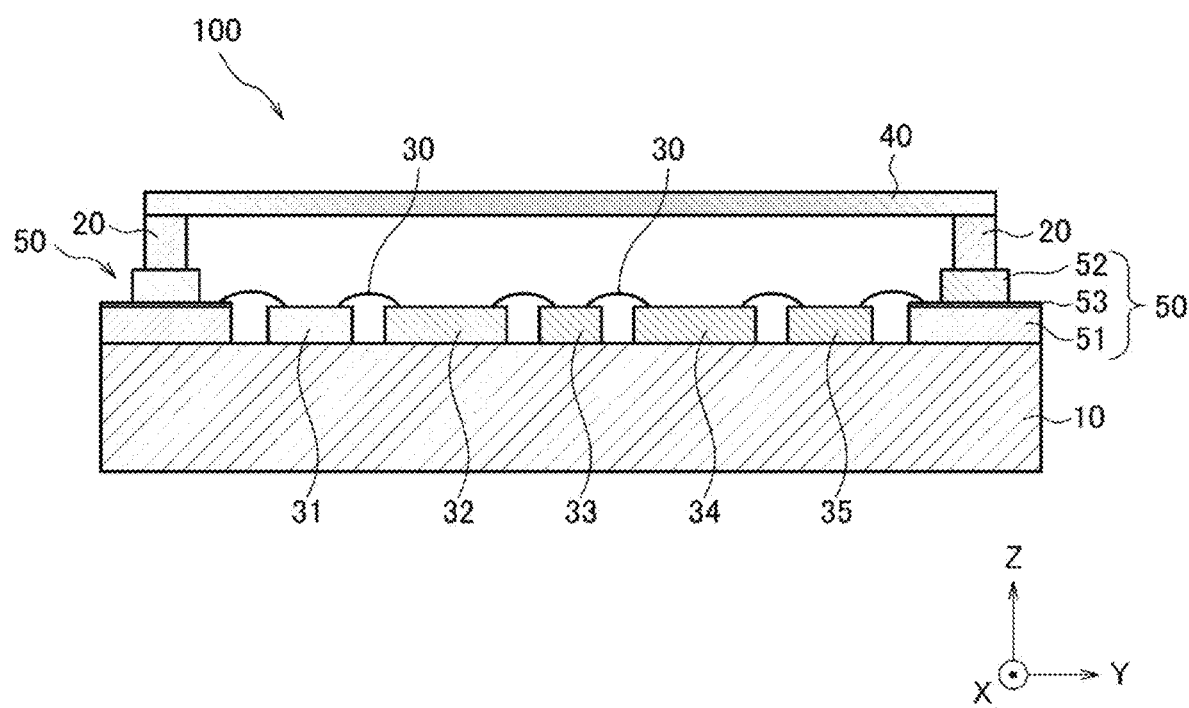
FIG. 2 is a cross-sectional view of the semiconductor device taken along line II-II in FIG. 1.

FIG. 1 is a plan view of a semiconductor device according to a first embodiment of the present disclosure, and FIG. 2 is a cross-sectional view of the semiconductor device taken along line II-II in FIG. 1. As illustrated in FIGS. 1 and 2, a semiconductor device 100 includes a metal base 10, a metal frame 20, a lid (cover) 40, an input-side branch circuit 31, an output-side multiplexing circuit 35, an input matching circuit 32, an output matching circuit 34, a semiconductor chip 33, and two feedthroughs 50. FIG. 1 is a view obtained by seeing through the lid 40.

The metal base 10 is formed by performing plating with, for example, Ni (nickel)/Au (gold) on the surface of a metal having a three-layered structure of Cu (copper)/Mo (molybdenum)/Cu (copper) with an area of about 5×10 mm$^2$ As a material of the metal base 10, Kovar, CuW (copper tungsten), CuMo (copper molybdenum), or the like may be exemplified, and the surface may be plated with Au, Ni, Ag (silver), Ag—Pt (platinum), Ag—Pb (lead), or the like. Notches 11 are formed at four places on both sides of the metal base 10 in the X-axis direction, and screws for mounting and fixing the metal base 10 on a substrate are inserted.

The metal frame 20 made of, for example, Kovar is provided on the upper side (plus side in the Z-axis direction) of the metal base 10, and the upper side of the metal frame 20 is covered by the lid 40 that is made of Kovar similarly to the metal frame 20. As a metal material of the metal frame 20 and the lid 40, CuW, CuMo or the like may be used in place of the Kovar. Cutouts 21 are respectively provided substantially at the centers of two walls of the metal frame 20 facing in the Y-axis direction, and the feedthroughs 50 for input and output are inserted into the two cutouts 21, respectively. In the present embodiment, the metal base 10, the metal frame 20, the lid 40, and the feedthroughs 50 constitute a package.

Of the two feedthroughs 50, for example, the feedthrough located on the minus side in the Y-axis direction is the feedthrough 50 for input, and the feedthrough located on the plus side in the Y-axis direction is the feedthrough 50 for output. A wiring pattern 53 is formed in each of the feedthroughs 50. Each of the wiring patterns 53 extends along the Y-axis direction.

As electronic components accommodated in the package, the semiconductor chip 33 including field effect transistors (FETs) configured by using, for example, a nitride semiconductor is mounted on the central portion of the inner space, and the input matching circuit 32 for input impedance adjustment and the output matching circuit 34 for output impedance adjustment are mounted with the semiconductor chip 33 interposed therebetween. In addition, the input-side branch circuit 31 and the output-side multiplexing circuit 35 are arranged outside the input matching circuit 32 and the output matching circuit 34, respectively. Since the width of the semiconductor chip 33 is larger than the wiring patterns 53 which become an input terminal or an output terminal, the input-side branch circuit 31 and the output-side multiplexing circuit 35 are provided in order to equally distribute an input signal to the respective FETs and in order to equally collect outputs from the FETs into the output terminal.

The electronic components of the input-side branch circuit 31, the input matching circuit 32, the semiconductor chip 33, the output matching circuit 34, and the output-side multiplexing circuit 35 are mounted on the upper surface of the metal base 10, and in the XY plane, the metal frame 20 surrounds these electronic components. These electronic components are hermetically sealed by the metal base 10, the metal frame 20, the lid 40, and the feedthroughs 50. In the semiconductor device 100, the feedthroughs 50, input-side branch circuit 31, the input matching circuit 32, the semiconductor chip 33, the output matching circuit 34, and the output-side multiplexing circuit 35 are arranged along the Y-axis direction, which is a straight line.

The wiring pattern 53 of the feedthrough 50 for input and the input-side branch circuit 31, the input-side branch circuit 31 and the input matching circuit 32, the input matching circuit 32 and the semiconductor chip 33, the semiconductor chip 33 and the output matching circuit 34, the output matching circuit 34 and the output-side multiplexing circuit 35, and the output-side multiplexing circuit 35 and the wiring pattern 53 of the feedthrough 50 for output are electrically connected by the bonding wires 30, respectively. The bonding wires 30 are made of, for example, a metal such as Au. The wiring pattern 53 is a part for electrically connecting the semiconductor chip 33 with an electrical part located outside the semiconductor device 100 via the input-side branch circuit 31 and the input matching circuit 32, or via the output matching circuit 34 and the output-side multiplexing circuit 35. In addition, a back surface electrode is formed on the semiconductor chip 33, and a potential of the back surface electrode is dropped down to the ground potential through the metal base 10.

The wiring patterns 53 located outside the metal frame 20 on the two feedthroughs 50 are provided with leads (not illustrated). For example, a radio frequency (RF) signal is input to the wiring pattern 53 from one (on the minus side in the Y-axis direction) of the two leads, and the RF signal is output from the other (on the plus side in the Y-axis direction) of the two leads. In addition, a bias voltage of the FET of the semiconductor chip 33 is input to the lead. The feedthrough 50 functions as a transmission line, and the RF signal flows through the feedthrough 50. The semiconductor device 100 functions as, for example, an amplifier that amplifies the RF signal.

Figure 3:
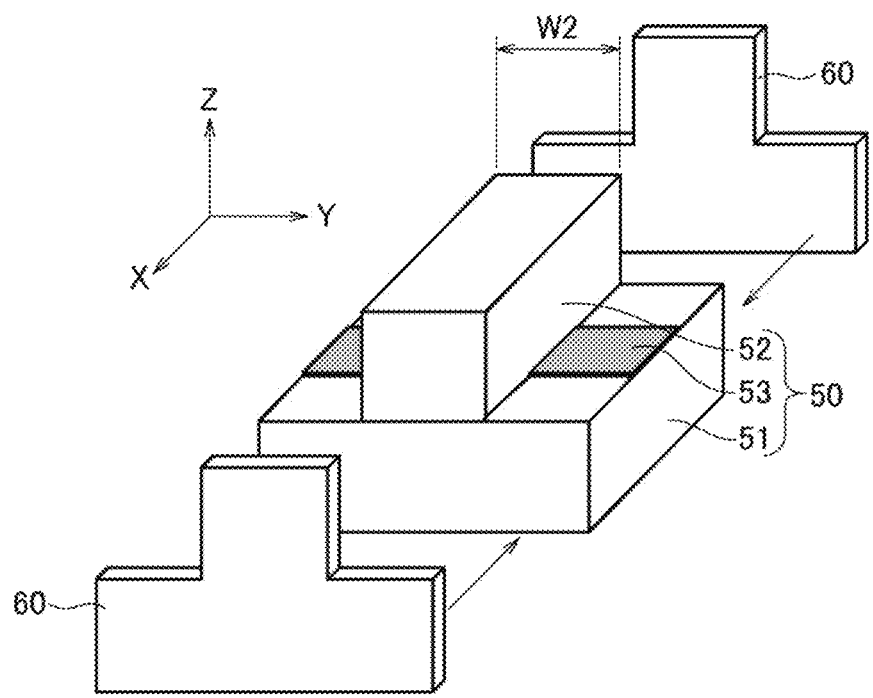
FIG. 3 is a view illustrating a feedthrough and a pair of side plates in the semiconductor device according to the first embodiment.
Figure 4:
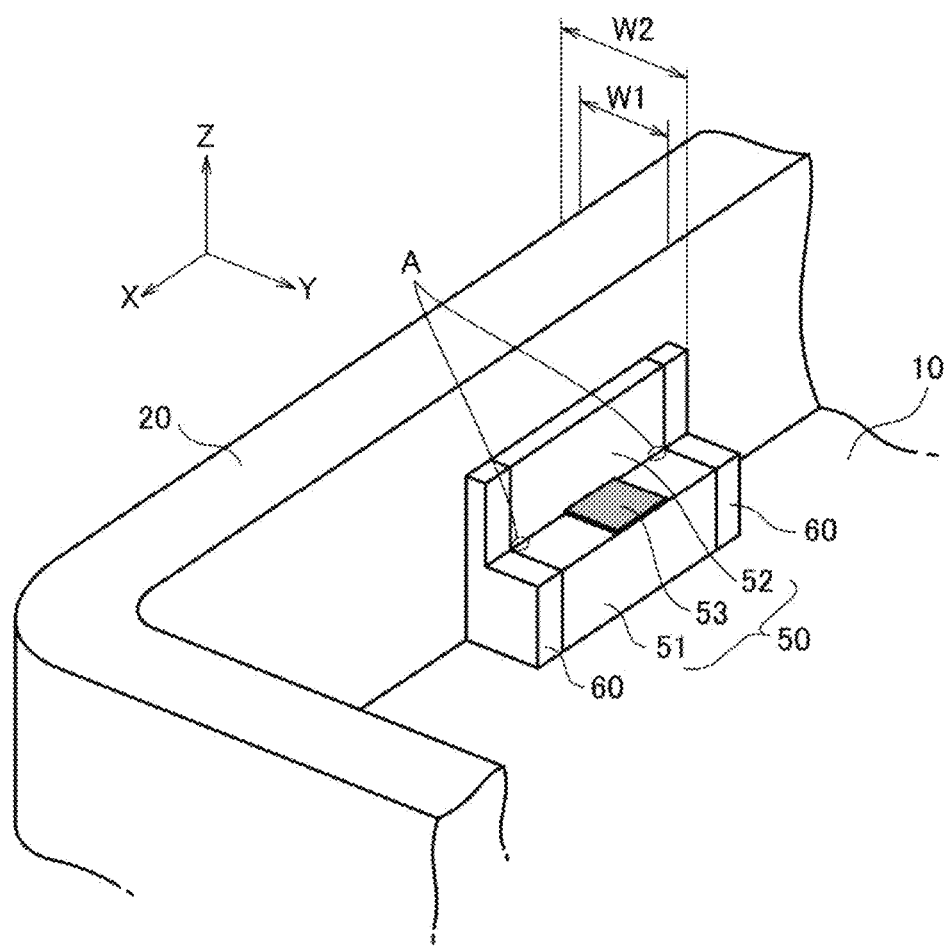
FIG. 4 is a view in which the feedthrough of the semiconductor device according to the first embodiment is viewed from the inside.

FIG. 3 is a view illustrating the feedthrough and the pair of side plates in the semiconductor device according to the first embodiment. FIG. 4 is a view in which the feedthrough in the semiconductor device according to the first embodiment is viewed from the inside. The feedthrough 50 includes, for example, a lower block 51 made of a ceramic such as alumina ($Al_2O_3$), the wiring pattern 53 formed on the upper surface of the lower block 51, and an upper block 52 made of a ceramic. The width W2 of the upper block 52 in the Y-axis direction is formed to be larger than the width W1 of the wall of the metal frame 20, and the width of the lower block 51 in the Y-axis direction is formed to be larger than the width W2 of the upper block 52. The upper block 52 is arranged at the central portion on the lower block 51 in the Y-axis direction, and both are integrally formed. Therefore, the sectional shape of the lower block 51 and the upper block 52 along the YZ plane, that is, along a direction (Z-axis direction) perpendicular to the extending direction of the wiring pattern 53 (Y-axis direction) of the feedthrough 50, is a protruding shape. A pair of side plates 60 is respectively provided on the entire surfaces of both side surfaces of the feedthrough 50 in the X-axis direction, as buffer materials. Each of the side plates 60 has a protruding shape and is configured with a metal plate made of, for example, Cu.

The side plate 60 preferably has a thickness of 300 µm or more and is bonded to the side surface of the feedthrough 50 made of alumina by a brazing material made of silver (Ag), copper (Cu), nickel (Ni), or the like. The feedthrough 50 to which the side plates 60 are bonded is inserted into the opening formed by the metal base 10 and the cutout 21 of the metal frame 20. For example, an Ag brazing material is provided in advance between the feedthrough 50 to which the side surface plates 60 are bonded and the opening, and the feedthrough 50 is fixed in the opening formed by the metal base 10 and the cutout 21 of the metal frame 20 by heating. At this time, as illustrated in FIG. 4, at least the upper block 52 is arranged so as to protrude into the space on the inner side of the metal frame 20. That is, an inner part of the upper block 52 is located inside the metal frame 20. In addition, when the feedthrough 50 is fixed, a brazing material or an adhesive is also provided between the metal frame 20 and the metal base 10, and the three components of the metal base 10, the metal frame 20, and the feedthrough 50 are fixed.

Herein, when stress analysis is performed by using thermal expansion, for example, in a case where the side plate 60 is not provided to the feedthrough 50 illustrated in FIG. 4 and the width W2 of the upper block 52 and the width W1 of the wall of the metal frame 20 are set to be the same, the stress is concentrated on the two ends in the X axis direction inside the space of the metal frame 20 at the boundary portion (a step) between the lower block 51 and the upper block 52 indicated by A in FIG. 4. This is also confirmed by the actual occurrence of cracks. The boundary portion between the lower block 51 and the upper block 52 is a place to which different members are bonded even though the material of the members is basically the same, and the central portion corresponds to a place to which both members are bonded with the wiring pattern 53 interposed therebetween. For this reason, it is considered that, since the stress is concentrated at the mechanically weak place, a crack easily occurs at the boundary portion.

In addition, as a cause of the stress concentration, while the thermal expansion coefficient of alumina which is the main material of the feedthrough 50 is about $7.2 \times 10^{-6}/°C.$, the thermal expansion coefficient of Kovar of the metal frame 20 surrounding the feedthrough 50 is about $4.8 \times 10^{-6}/°C.$, and the thermal expansion coefficient of Cu of the metal base is about $16.7 \times 10^{-6}/°C.$ The upper block 52 of the feedthrough 50 is fixed only to the metal frame 20, but the lower block 51 is also fixed to the metal base 10 in addition to the metal frame 20. For this reason, it is considered that due to the difference in stress that is caused by the thermal expansion and contraction and exerted on the lower block 51 and the upper block 52, the stress is concentration on the portion close to the metal frame 20 in the boundary portion between the lower block 51 and the upper block 52.

On the other hand, in the present embodiment, the upper block 52 of the feedthrough 50 is configured to protrude from the metal frame 20 at least into the space on the inner side of the metal frame 20, so that the position of the boundary portion between the lower block 51 and the upper block 52 is allowed to be away from the metal frame 20, and the side plate that is made of a metal and covers the entire side surface of the feedthrough 50 is provided between the metal frame 20 and the cutout 21 of the metal frame 20, so that the difference in stress exerted on the lower block 51 and the upper block 52 is reduced. For this reason, it is possible to prevent a crack from occurring at the boundary portion.

Second Embodiment

Figure 5:
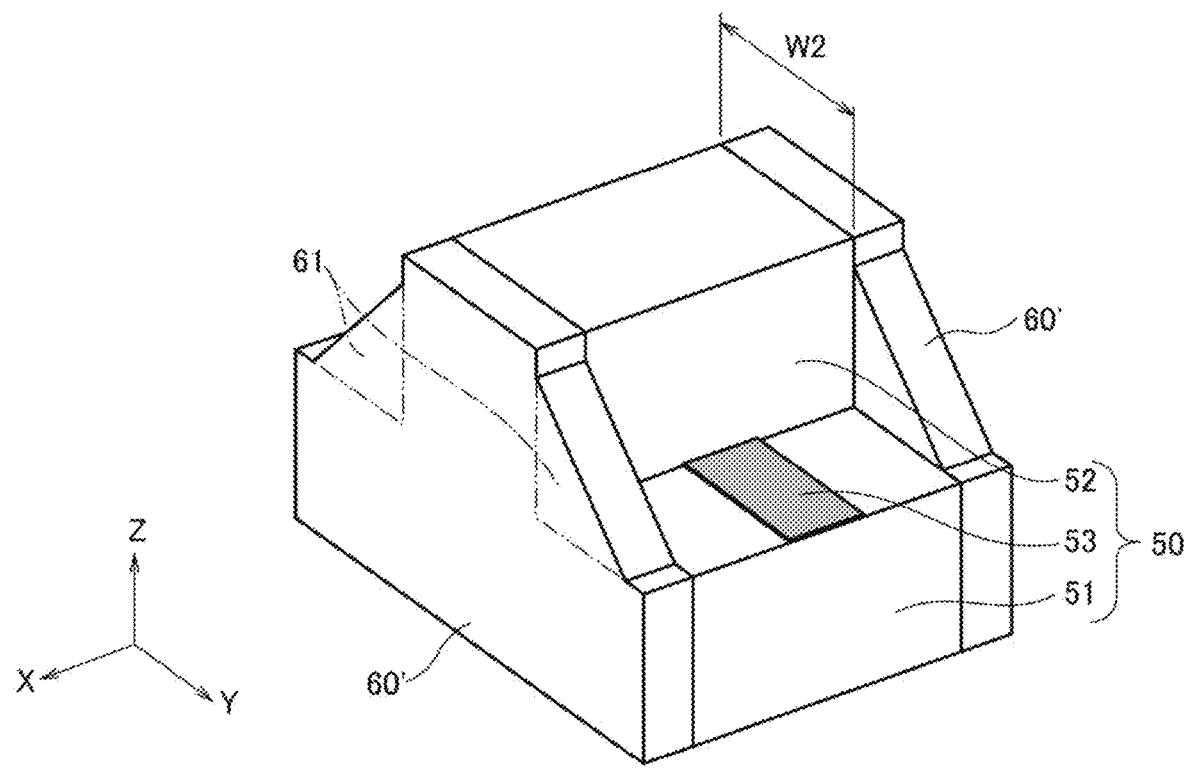
FIG. 5 is a perspective view illustrating a feedthrough to which side plates are bonded in a semiconductor device according to a second embodiment.

FIG. 5 is a perspective view illustrating a feedthrough to which side plates are bonded in a semiconductor device according to a second embodiment. As compared with the first embodiment, in the second embodiment, each of side plates 60' integrally has a reinforcement portion 61 indicated by broken lines. The reinforcement portion 61 is different in that the reinforcing portion has a triangular shape filling the step of the side plate 60 of the first embodiment from the first embodiment. Then, although the reinforcement portion 61 is provided at least in the inner space side of the metal frame 20 of the feedthrough 50, the reinforcing portion may be also provided in the outer side of the metal frame 20. Since the side plate 60' has the reinforcing portion 61, the difference in stress exerted on the upper block 52 made of a ceramic and the lower block 51 made of a ceramic of the feedthrough 50 is further reduced by the reinforcement portion 61, so that it is possible to further suppress the occurrence of a crack at the bonded portion caused by the stress.

Third Embodiment

Figure 6:
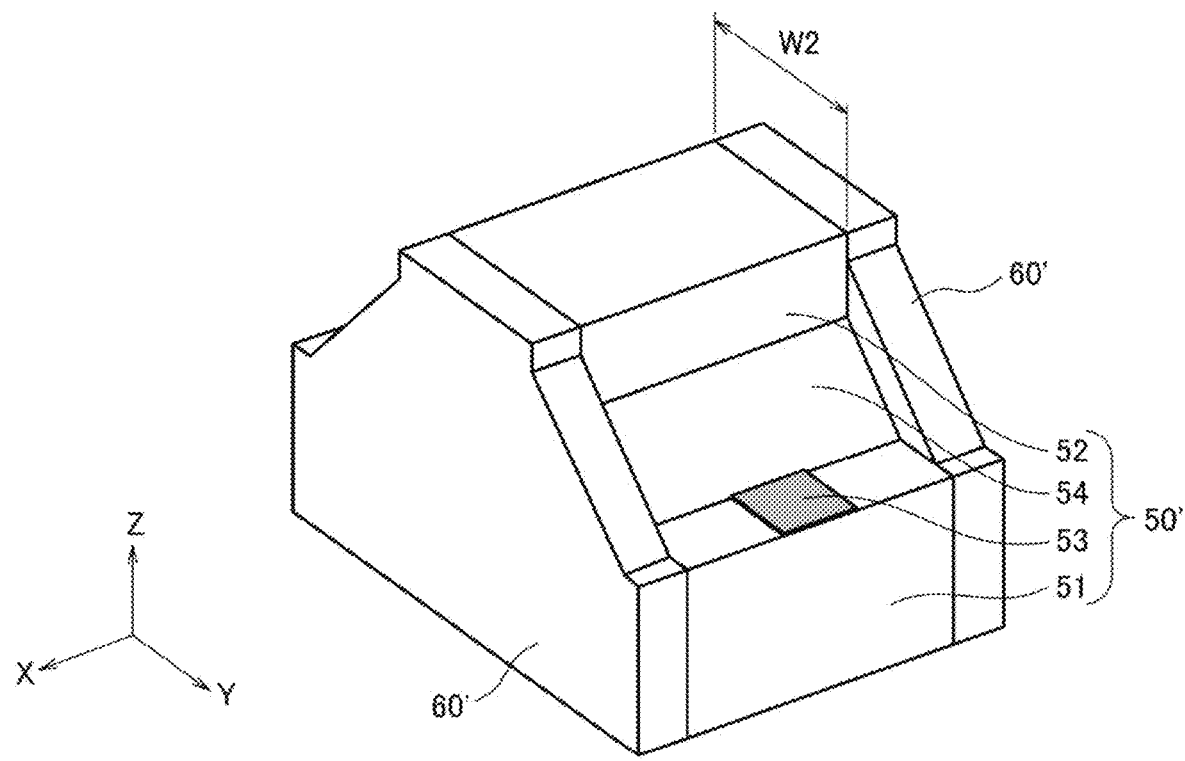
FIG. 6 is a perspective view illustrating a feedthrough to which side plates are bonded in a semiconductor device according to a third embodiment.

FIG. 6 is a perspective view illustrating a feedthrough to which side plates are bonded in a semiconductor device according to a third embodiment. The third embodiment is different from the second embodiment in that the feedthrough 50 has a triangular prism-shaped reinforcement portion 54 filling the step on the inner space side of the metal frame 20. The triangular prism-shaped reinforcement portion 54 is made of a ceramic like the lower block 51 and the upper block 52, and the lower block 51, the upper block 52, and the reinforcement portion 54 are integrally formed. For this reason, since the boundary portion between the upper block made of a ceramic and the lower block made of a ceramic of the feedthrough 50 is integrally covered and reinforced by the triangular reinforcement portion 54, it is possible to further relieve the influence of the stress exerted on both as compared with the second embodiment.

What is claimed is:

1. A semiconductor device comprising:
a metal base;
a metal frame placed on the metal base, the metal frame being provided with at least one cutout penetrating therethrough;
a semiconductor element mounted on the metal base in a space defined by the metal base and the metal frame;
a feedthrough inserted into the cutout of the metal frame and mounted on the metal base, the feedthrough including a wiring configured to electrically connect the semiconductor element located inside the space with an electrical part located outside the semiconductor device, a lower block made of a ceramic and mounting the wiring thereon, and an upper block made of a ceramic and mounted on the lower block, wherein a combined sectional shape of the lower block and the upper block is a projecting shape along a mounting direction of the upper block on the lower block, and a part of the upper block is located inside the frame, and
a metal side plate fixed to a side surface of the feedthrough by a brazing material, the metal plate entirely covering the side surface of the feedthrough and being provided between the side surface of the feedthrough and the metal frame to spread along an extending direction of the wiring.

2. The semiconductor device according to claim 1, wherein the metal side plate is made of copper.

3. The semiconductor device according to claim 1, wherein the metal side plate has a thickness of at least 300 mm.

4. The semiconductor device according to claim 1, further comprising at least one electric circuit located inside the metal frame, wherein the wiring of the feedthrough is configured to electrically connect the semiconductor element to the electrical part via the at least one electric circuit.

5. The semiconductor device according to claim 1, further comprising another side plate entirely covering an opposite side surface of the feedthrough.

6. The semiconductor device according to claim 1, wherein the brazing material is made of at least one of silver, copper and nickel.

7. The semiconductor device according to claim 1, wherein the metal side plate is one member having a projecting shape.

8. The semiconductor device according to claim 1, where an inner part of the upper block protrudes from an inner surface of the metal frame.

9. The semiconductor device according to claim 1, wherein the upper block has a width larger than a width of a wall of the metal frame, the wall being provided with the cutout.

10. The semiconductor device according to claim 1, where an outer part of the upper block protrudes from an outer surface of the metal frame.

11. The semiconductor device according to claim 1, wherein the upper block is arranged at a central portion of the lower block.

12. The semiconductor device according to claim 1, wherein the metal side plate further includes a triangular reinforcement portion filling a step of the side plate, the side plate step being located inside the space.

13. The semiconductor device according to claim 12, wherein the feedthrough further includes a triangular prism-shaped reinforcement portion filling a step of the feedthrough, the feedthrough step being located inside the space.

14. The semiconductor device according to claim 1, further comprising another feedthrough inserted into another cutout of the metal frame and mounted on the metal base.

15. The semiconductor device according to claim 14, wherein the another feedthrough includes another wiring configured to electrically connect the semiconductor element with another electrical part located outside the semiconductor device, another lower block made of a ceramic and mounting the another wiring thereon, and another upper block made of a ceramic and mounted on the another lower block, wherein a combined sectional shape of the another lower block and the another upper block is a projecting shape along a mounting direction of the another upper block on the another lower block and a part of the another upper block is located inside the metal frame.

16. The semiconductor device according to claim 14, wherein the feedthrough, the semiconductor element and the another feedthrough are arranged along a straight line.

* * * * *